(12) United States Patent
Masuda et al.

(10) Patent No.: US 12,438,246 B2
(45) Date of Patent: Oct. 7, 2025

(54) TRANSMISSION LINE AND ELECTRONIC DEVICE

(71) Applicant: Murata Manufacturing Co., Ltd., Nagaokakyo (JP)

(72) Inventors: Masaki Masuda, Nagaokakyo (JP); Nobuyuki Tenno, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 341 days.

(21) Appl. No.: 18/122,845

(22) Filed: Mar. 17, 2023

(65) Prior Publication Data

US 2023/0216168 A1 Jul. 6, 2023

Related U.S. Application Data

(63) Continuation of application No. PCT/JP2021/032882, filed on Sep. 7, 2021.

(30) Foreign Application Priority Data

Oct. 1, 2020 (JP) ................................. 2020-166923

(51) Int. Cl.
*H01P 3/08* (2006.01)
*H05K 1/02* (2006.01)

(52) U.S. Cl.
CPC ............. *H01P 3/08* (2013.01); *H05K 1/0237* (2013.01)

(58) Field of Classification Search
CPC ................................. H01P 3/08; H05K 1/0237
See application file for complete search history.

(56) References Cited

U.S. PATENT DOCUMENTS

| 2019/0081380 | A1* | 3/2019 | Bates | H01L 23/5387 |
| 2021/0274651 | A1* | 9/2021 | Nagai | H01P 3/04 |
| 2021/0288390 | A1* | 9/2021 | Tago | H05K 1/02 |

FOREIGN PATENT DOCUMENTS

| JP | 2012227632 A | 11/2012 | |
| WO | WO-2020129827 A1 * | 6/2020 | H01P 3/026 |
| WO | WO-2020130010 A1 * | 6/2020 | H01P 3/003 |

OTHER PUBLICATIONS

International Search Report and Written Opinion in PCT/JP2021/032882, mailed Nov. 16, 2021, 3 pages.
Written Opinion in PCT/JP2021/032882, mailed Nov. 16, 2021, 3 pages.

* cited by examiner

*Primary Examiner* — Samuel S Outten
(74) *Attorney, Agent, or Firm* — Keating & Bennett, LLP

(57) ABSTRACT

In a transmission line, a thickness of a second section is smaller than that of a first section and of a third section. A center of the second section is above a center of the first section and a center of the third section in a laminated body up-down direction. A distance between a second signal conductor layer and a neutral plane of the second section is shorter than a distance between a first signal conductor layer and a neutral plane of the second section and a distance between a third signal conductor layer and a neutral plane of the second section in the laminated body up-down direction. A length of the second signal conductor layer between first and second interlayer connection conductors is equal to or less than about ½ of a wavelength of a high-frequency signal transmitted by the transmission line.

20 Claims, 10 Drawing Sheets

Fig.3
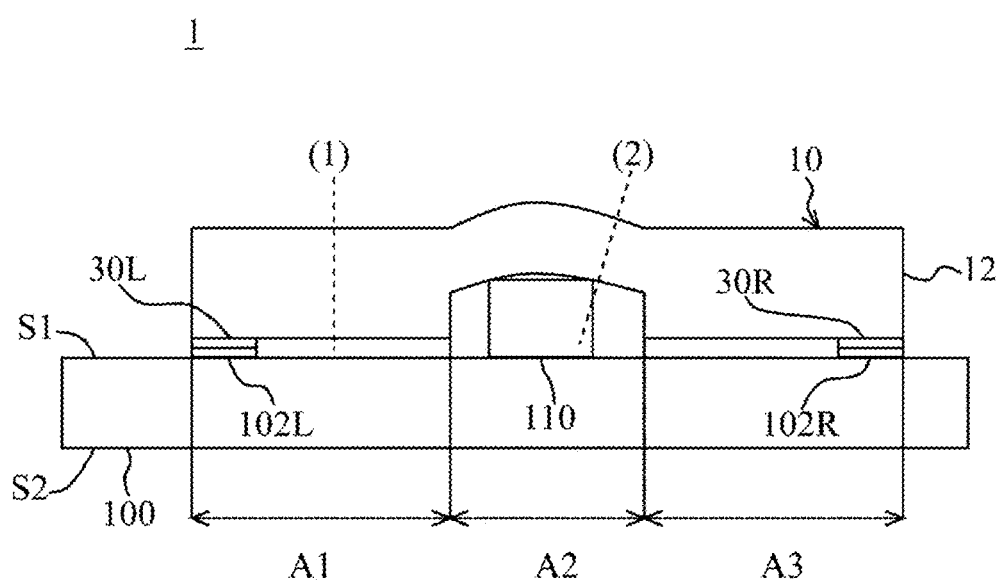
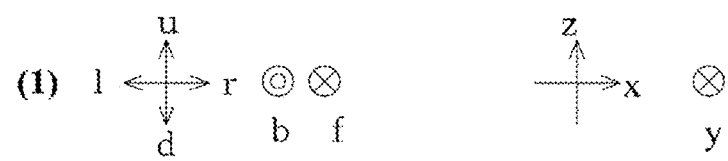
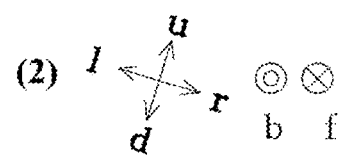

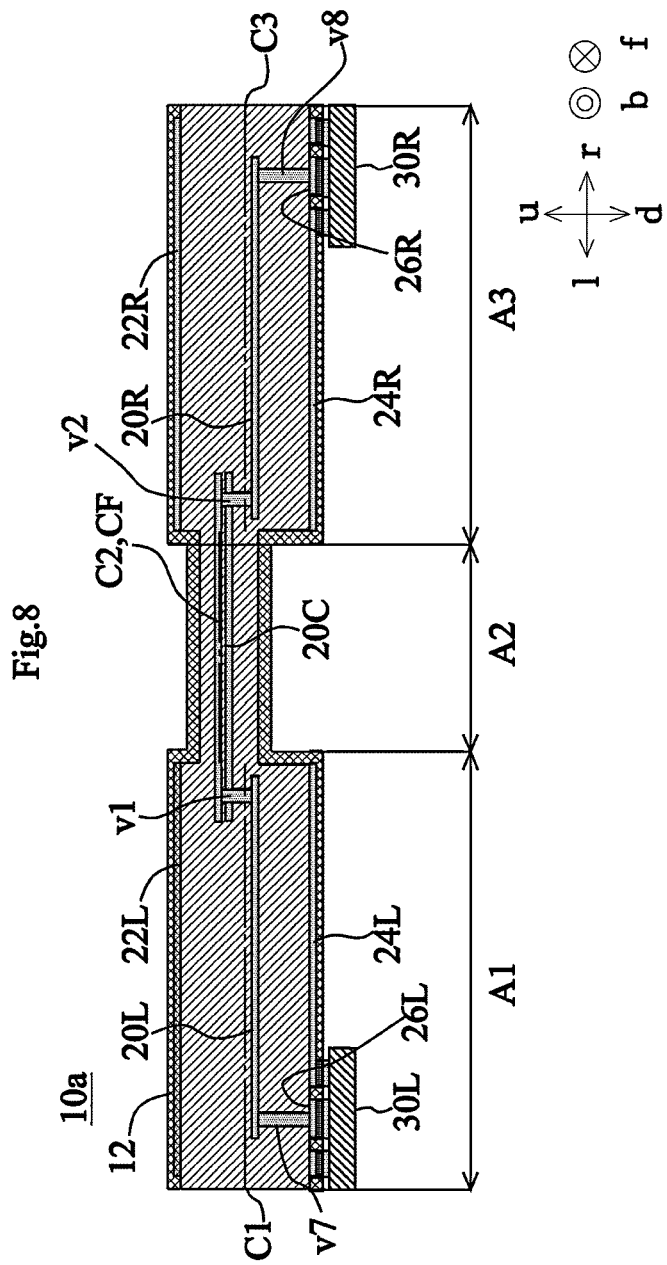

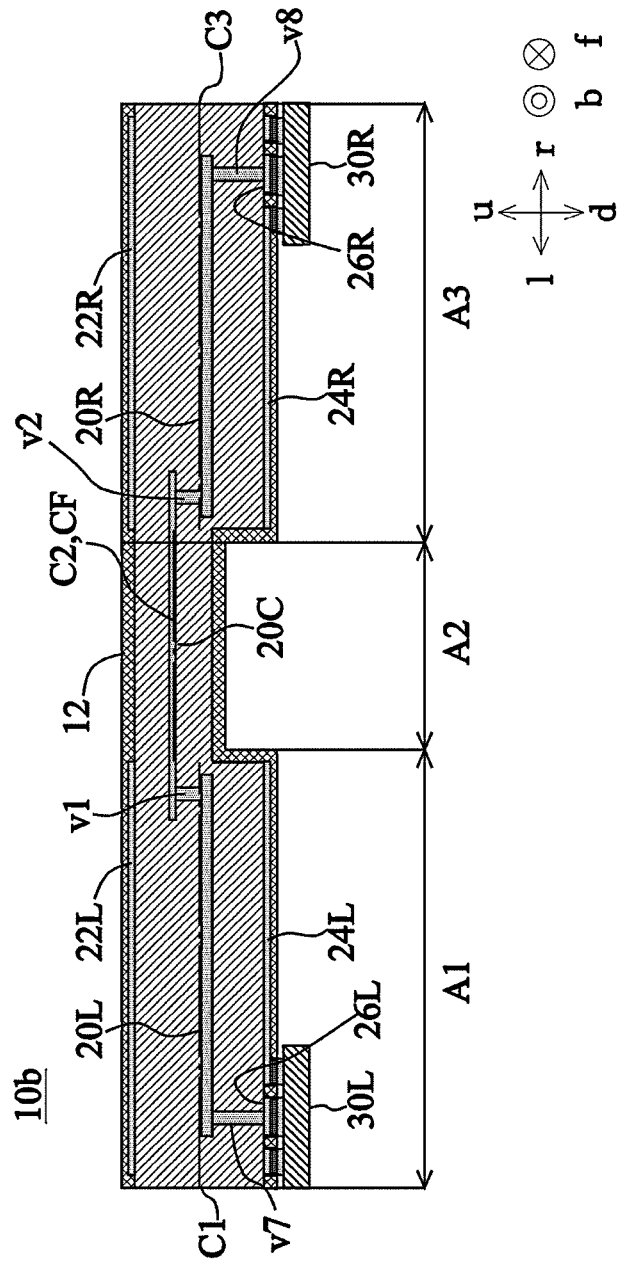

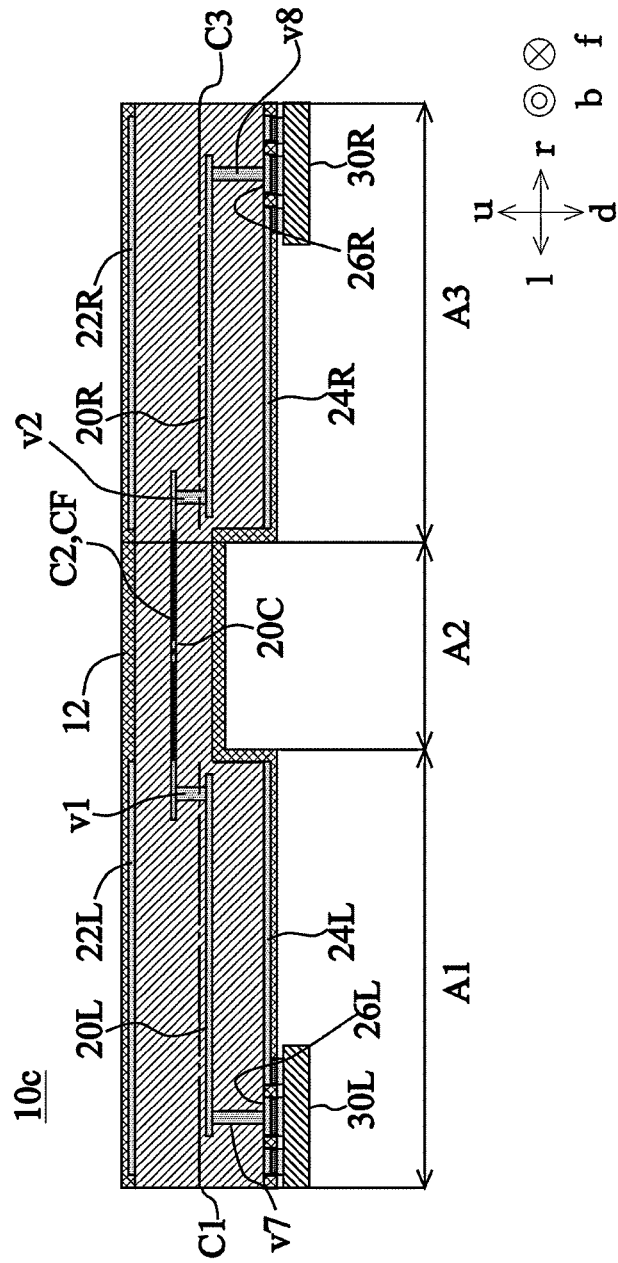

TRANSMISSION LINE AND ELECTRONIC DEVICE

CROSS REFERENCE TO RELATED APPLICATIONS

This application claims the benefit of priority to Japanese Patent Application No. 2020-166923 filed on Oct. 1, 2020 and is a Continuation Application of PCT Application No. PCT/JP2021/032882 filed on Sep. 7, 2021. The entire contents of each application are hereby incorporated herein by reference.

BACKGROUND OF THE INVENTION

1. Field of the Invention

The present invention relates to a transmission line through which a high-frequency signal is transmitted, and an electronic device.

2. Description of the Related Art

As an invention related to an existing transmission line, for example, a transmission line member described in International Publication No. 2020/130010 has been known. The transmission line member includes a first portion, a second portion, and a third portion. The second portion is connected between the first portion and the third portion. The thickness of the second portion is smaller than the thickness of the first portion and the thickness of the third portion. Accordingly, the second portion can be easily bent.

SUMMARY OF THE INVENTION

The transmission line member described in International Publication No. 2020/130010 may be used in a bent state in a narrow space within an electronic device. At this time, articles such as electronic components may be present around the transmission line member. Therefore, in the transmission line member, it is required to suppress breakage of the transmission line member due to bending of the transmission line member, and it is also required to arrange articles around the transmission line member with a high degree of freedom. Further, since articles are present around the transmission line member, it is required to suppress generation of unnecessary radiation.

Preferred embodiments of the present invention provide transmission lines and electronic devices in each of which an article can be arranged around the transmission line with a high degree of freedom, breakage of the transmission line due to bending of the transmission line can be reduced or prevented, and an occurrence of unnecessary radiation can be reduced or prevented.

A transmission line to transmit a high-frequency signal, according to an aspect of a preferred embodiment of the present invention, includes a laminated body having a structure in which a plurality of insulator layers is laminated in a laminated body up-down direction, the laminated body including a first section, a second section, and a third section, the first section, the second section, and the third section being arranged in this order in a transmission direction of the high-frequency signal, a first signal conductor layer in the first section, a second signal conductor layer in the first section, the second section, and the third section, a third signal conductor layer in the third section, a first interlayer connection conductor that penetrates the insulator layer in the laminated body up-down direction in the first section and electrically connects the first signal conductor layer and the second signal conductor layer to each other, and a second interlayer connection conductor that penetrates the insulator layer in the laminated body up-down direction in the third section and electrically connects the second signal conductor layer and the third signal conductor layer to each other, wherein the second signal conductor layer defines a coplanar line structure in the second section, a thickness of the second section in the laminated body up-down direction is smaller than a thickness of the first section in the laminated body up-down direction and a thickness of the third section in the laminated body up-down direction, a center of the second section in the laminated body up-down direction is above, in the laminated body up-down direction, a center of the first section in the laminated body up-down direction and a center of the third section in the laminated body up-down direction, a distance between the second signal conductor layer and a neutral plane of the second section in the laminated body up-down direction is shorter than a distance between the first signal conductor layer and the neutral plane of the second section in the laminated body up-down direction and a distance between the third signal conductor layer and the neutral plane of the second section in the laminated body up-down direction, a position of the second signal conductor layer in the laminated body up-down direction is above, in the laminated body up-down direction, a position of the first signal conductor layer in the laminated body up-down direction and a position of the third signal conductor layer in the laminated body up-down direction, and a length of the second signal conductor layer between the first interlayer connection conductor and the second interlayer connection conductor is equal to or less than about ½ of a wavelength of the high-frequency signal.

An electronic device according to an aspect of a preferred embodiment of the present invention includes a first circuit substrate including a first circuit substrate first main surface and a first circuit substrate second main surface, a transmission line electrically connected to the first circuit substrate to transmit a high-frequency signal, wherein the transmission line includes a laminated body including a structure in which a plurality of insulator layers is laminated in a laminated body up-down direction, the laminated body including a first section, a second section, and a third section, the first section, the second section, and the third section being arranged in this order in a transmission direction of the high-frequency signal, a first signal conductor layer in the first section, a second signal conductor layer in the first section, the second section, and the third section, a third signal conductor layer in the third section, a first interlayer connection conductor that penetrates the insulator layer in the laminated body up-down direction in the first section and electrically connects the first signal conductor layer and the second signal conductor layer to each other, and a second interlayer connection conductor that penetrates the insulator layer in the laminated body up-down direction in the third section and electrically connects the second signal conductor layer and the third signal conductor layer to each other, the second signal conductor layer defines a coplanar line structure in the second section, a thickness of the second section in the laminated body up-down direction is smaller than a thickness of the first section in the laminated body up-down direction and a thickness of the third section in a laminated body up-down direction, a center of the second section in the laminated body up-down direction is above, in the laminated body up-down direction, a center of the first section in the laminated body up-down direction and a center of the third section in the laminated body up-down direction, a distance between the second signal conductor layer and a neutral plane of the second section in the laminated body up-down direction is shorter than a distance between the first signal conductor layer and the neutral plane of the second section in the laminated body up-down direction and a distance between the third signal conductor layer and the neutral plane of the second section in the laminated body up-down direction, a position of the second signal conductor layer in the laminated body up-down direction is above, in the laminated body up-down direction, a position of the first signal conductor layer in the laminated body up-down direction and a position of the third signal conductor layer in the laminated body up-down direction, and a length of the second signal conductor layer between the first interlayer connection conductor and the second interlayer connection conductor is equal to or less than about ½ of a wavelength of the high-frequency signal.

According to the transmission lines and the electronic devices according to preferred embodiments of the present invention, it is possible to bend the transmission line while reducing or preventing the occurrence of breakage in the transmission line, and to reduce or prevent the occurrence of unnecessary radiation.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a back view of an electronic device 1 including the transmission line 10.

FIG. 4 is a back view of an electronic device 1a.

FIG. 7 is an exploded perspective view of a transmission line 10a.

FIG. 8 is a cross-sectional view of the transmission line 10a taken along a line A-A in FIG. 5.

FIG. 9 is a cross-sectional view of a transmission line 10b.

FIG. 10 is a cross-sectional view of a transmission line 10c.

DETAILED DESCRIPTION OF THE PREFERRED EMBODIMENTS

Preferred Embodiments

Structure of Transmission Line

Figure 1:
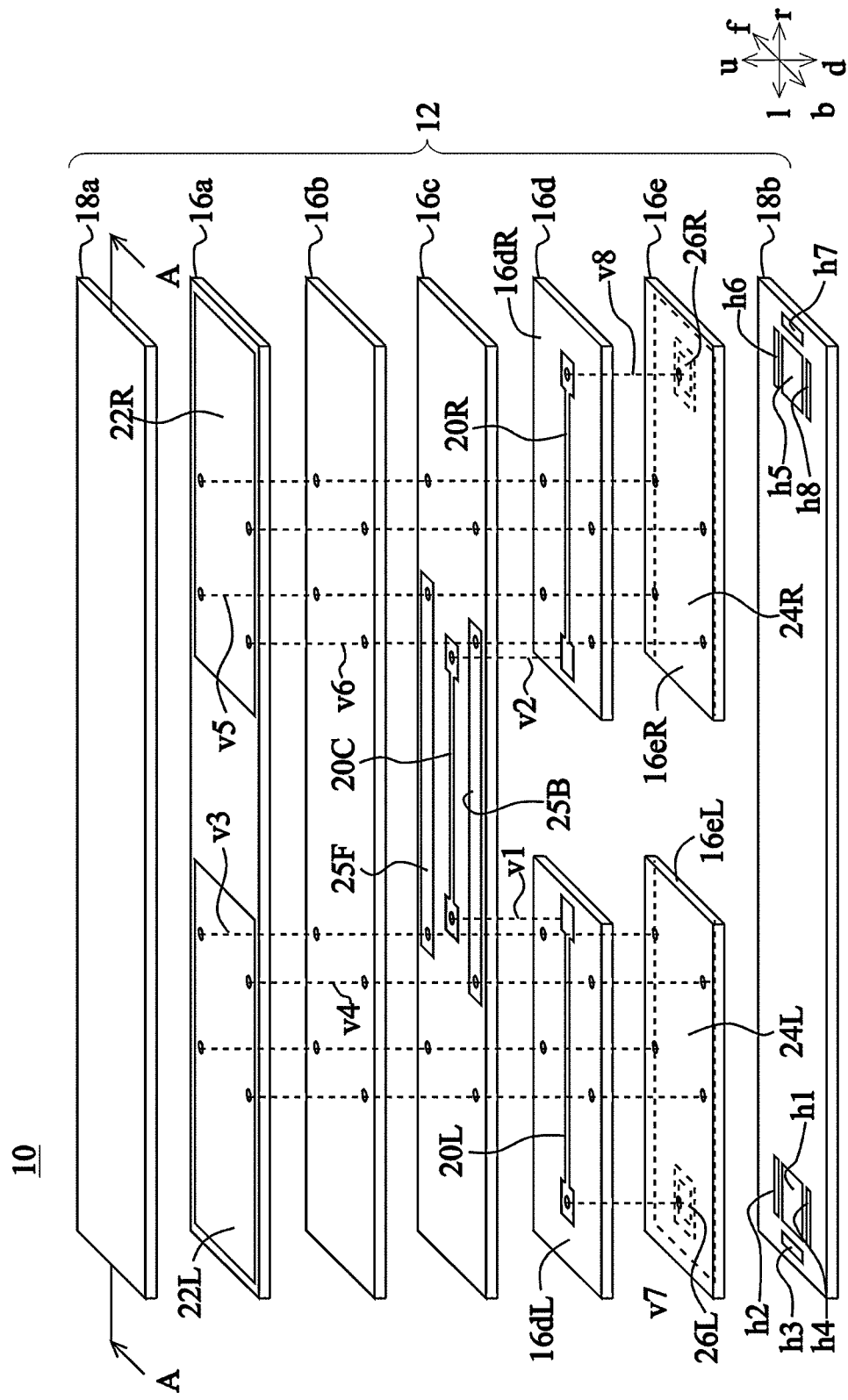
FIG. 1 is an exploded perspective view of a transmission line 10.
Figure 2:
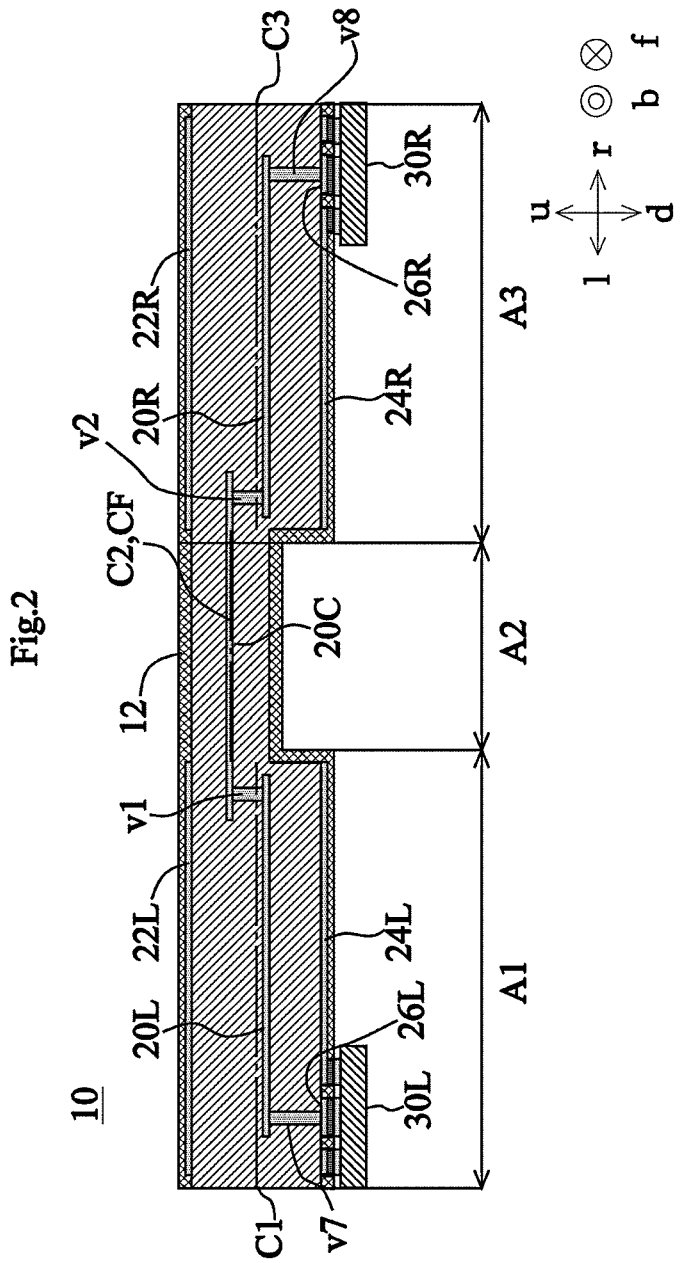
FIG. 2 is a cross-sectional view of the transmission line 10 taken along a line A-A in FIG. 1.

Hereinafter, structures of transmission lines according to preferred embodiments of the present invention will be described with reference to the drawings. FIG. 1 is an exploded perspective view of a transmission line 10. FIG. 2 is a cross-sectional view of the transmission line 10 taken along a line A-A of FIG. 1.

In the present specification, directions are defined as follows. A laminating direction of a laminated body 12 of the transmission line 10 is defined as a laminated body up-down direction. A transmission direction of a high-frequency signal is defined as a laminated body left-right direction. The laminated body up-down direction and the laminated body left-right direction are orthogonal to each other. A direction orthogonal to the laminated body up-down direction and the laminated body left-right direction is defined as a laminated body front-back direction.

Hereinafter, X is a component or portion of the transmission line 10. In this specification, unless otherwise specified, each portion of X is defined as follows. The front portion of X means the front half of X. The back portion of X means the back half of X. The left portion of X means the left half of X. The right portion of X means the right half of X. The upper portion of X means the upper half of X. The lower portion of X means the lower half of X. The front end of X means an end of X in the front direction. The back end of X means an end of X in the back direction. The left end of X means an end of X in the left direction. The right end of X means an end of X in the right direction. The upper end of X means an end of X in the upward direction. The lower end of X means an end of X in the downward direction. The front end portion of X means the front end of X and its vicinity. The back end portion of X means the back end of X and its vicinity. The left end portion of X means the left end of X and its vicinity. The right end portion of X means the right end of X and its vicinity. The upper end portion of X means the upper end of X and its vicinity. The lower end portion of X means the lower end of X and its vicinity.

First, the structure of the transmission line 10 will be described with reference to FIG. 1 and FIG. 2. The transmission line 10 transmits a high-frequency signal. As illustrated in FIG. 1, the transmission line 10 is used to electrically connect two circuits in an electronic device such as a smartphone. As illustrated in FIG. 2 and FIG. 3, the transmission line 10 includes the laminated body 12, a first signal conductor layer 20L, a second signal conductor layer 20C, a third signal conductor layer 20R, ground conductor layers 22L, 22R, 24L, 24R, 25F, and 25B, outer electrodes 26L and 26R, and interlayer connection conductors v1 to v8.

The laminated body 12 has a plate shape. As illustrated in FIG. 2, the laminated body 12 has a rectangular or substantially rectangular shape having long sides extending in the laminated body left-right direction when viewed in the laminated body up-down direction. Therefore, the length of the laminated body 12 in the laminated body left-right direction is longer than the length of the laminated body 12 in the laminated body front-back direction.

The laminated body 12 includes a first section A1, a second section A2, and a third section A3. The laminated body 12 of the transmission line 10 has a structure in which the first section A1, the second section A2, and the third section A3 are arranged in this order in a transmission direction of a high-frequency signal (a laminated body left-right direction). The first section A1 is located to the left of the second section A2 in the laminated body left-right direction. The first section A1 is adjacent to the second section A2. The third section A3 is located to the right of the second section A2 in the laminated body left-right direction. The third section A3 is adjacent to the second section A2. The first section A1 is a section in which the laminated body 12 is not bent in the laminated body up-down direction in the first section A1. The second section A2 is a section in which the laminated body 12 is bent in the laminated body up-down direction in the second section A2. The third section A3 is a section in which the laminated body 12 is not bent in the laminated body up-down direction in the third section A3.

As illustrated in FIG. 2 and FIG. 3, the laminated body 12 has a structure in which insulator layers 16a to 16e and resist layers 18a and 18b are laminated in the laminated body up-down direction. The resist layer 18a, the insulator layers 16a to 16e, and the resist layer 18b are laminated so as to be arranged in this order from top to bottom in the laminated body up-down direction. The insulator layers 16a to 16e are dielectric sheets having flexibility. Materials of the insulator layers 16a to 16e are made of thermoplastics such as polyimide and liquid crystal polymer.

In addition, the thickness of the second section A2 in the laminated body up-down direction is smaller than the thickness of the first section A1 in the laminated body up-down direction and the thickness of the third section A3 in the laminated body up-down direction. Furthermore, the second section A2 is offset in the laminated body upward direction with respect to the first section A1 and the third section A3. That is, a center C2 of the second section A2 in the laminated body up-down direction is located above, in the laminated body up-down direction, a center C1 of the first section A1 in the laminated body up-down direction and a center C3 of the third section A3 in the laminated body up-down direction. Further, the upper main surface of the laminated body 12 is a plane. Therefore, the position of the upper main surface of the first section A1 in the laminated body up-down direction, the position of the upper main surface of the second section A2 in the laminated body up-down direction, and the position of the upper main surface of the third section A3 in the laminated body up-down direction are the same. In order to satisfy these conditions, the insulator layers 16a to 16e have a structure described below.

The insulator layers 16a to 16c preferably have the same rectangular or substantially rectangular shape as the laminated body 12 when viewed in the laminated body up-down direction. The insulator layer 16d includes an insulator layer 16dL and an insulator layer 16dR. The insulator layer 16dL is provided in the first section A1. The insulator layer 16dR is provided in the third section A3. Therefore, the insulator layer 16d is not provided in the second section A2. The insulator layer 16e includes an insulator layer 16eL and an insulator layer 16eR. The insulator layer 16eL is provided in the first section A1. The insulator layer 16eR is provided in the third section A3. Therefore, the insulator layer 16e is not provided in the second section A2. Note that details of the resist layers 18a and 18b will be described later.

As illustrated in FIG. 2, the first signal conductor layer 20L is provided in the first section A1 of the laminated body 12. More specifically, the first signal conductor layer 20L is provided on the upper main surface of the insulator layer 16dL. Thus, the first signal conductor layer 20L is provided inside the laminated body 12. The first signal conductor layer 20L has a linear shape. The first signal conductor layer 20L extends in the laminated body left-right direction. The first signal conductor layer 20L is located at the center of the upper main surface of the insulator layer 16dL in the laminated body front-back direction.

As illustrated in FIG. 2, the third signal conductor layer 20R is provided in the third section A3 of the laminated body 12. However, the structure of the third signal conductor layer 20R is bilaterally symmetrical to the structure of the first signal conductor layer 20L. Therefore, the description of the third signal conductor layer 20R is omitted.

As illustrated in FIG. 2, the second signal conductor layer 20C is provided in the first section A1, the second section A2, and the third section A3 of the laminated body 12. More specifically, the second signal conductor layer 20C is provided on the upper main surface of the insulator layer 16c. Thus, the position of the second signal conductor layer 20C in the laminated body up-down direction is above, in the laminated body up-down direction, the position of the first signal conductor layer 20L in the laminated body up-down direction and the position of the third signal conductor layer 20R in the laminated body up-down direction.

Furthermore, the distance between the second signal conductor layer 20C and a neutral plane CF of the second section A2 in the laminated body up-down direction is shorter than the distance between the first signal conductor layer 20L and the neutral plane CF of the second section A2 in the laminated body up-down direction and the distance between the third signal conductor layer 20R and the neutral plane CF of the second section A2 in the laminated body up-down direction. In the present preferred embodiment, the position of the second signal conductor layer 20C in the laminated body up-down direction includes the position of the neutral plane CF of the second section A2 in the laminated body up-down direction. Therefore, the neutral plane CF is located between the upper main surface of the second signal conductor layer 20C and the lower main surface of the second signal conductor layer 20C. The neutral plane CF is a plane in which compressive stress and tensile stress are not generated when the second section A2 is bent in an up-down direction. The neutral plane CF is located in the vicinity of the center of the second section A2 in the laminated body up-down direction in many cases. In the present preferred embodiment, the neutral plane CF coincides with the center C2 of the second section A2 in the laminated body up-down direction. However, the neutral plane CF and the center C2 need not coincide with each other.

The second signal conductor layer 20C is provided inside the laminated body 12. The second signal conductor layer 20C has a linear shape. The second signal conductor layer 20C extends in the laminated body left-right direction. The second signal conductor layer 20C is located at the center in the front-back direction of the upper main surface of the insulator layer 16dL. The left end of the second signal conductor layer 20C is located at the right end portion of the first section A1. The left end portion of the second signal conductor layer 20C overlaps the right end portion of the first signal conductor layer 20L when viewed in the laminated body up-down direction. The right end of the second signal conductor layer 20C is located at the left end portion of the third section A3. The right end portion of the second signal conductor layer 20C overlaps the left end portion of the third signal conductor layer 20R when viewed in the laminated body up-down direction.

The interlayer connection conductor v1 (first interlayer connection conductor) passes through the insulator layer 16c in the laminated body up-down direction in the first section A1. The interlayer connection conductor v1 electrically connects the first signal conductor layer 20L and the second signal conductor layer 20C. More specifically, the lower end of the interlayer connection conductor v1 is connected to the right end portion of the first signal conductor layer 20L. The upper end of the interlayer connection conductor v1 is connected to the left end portion of the second signal conductor layer 20C. The interlayer connection conductor v2 (second interlayer connection conductor) passes through the insulator layer 16c in the laminated body up-down direction in the third section A3. The interlayer connection conductor v2 electrically connects the second signal conductor layer 20C and the third signal conductor layer 20R. More specifically, the lower end of the interlayer connection conductor v2 is connected to the left end portion of the third signal conductor layer 20R. The upper end of the interlayer connection conductor v2 is connected to the right end portion of the second signal conductor layer 20C. Thus, the first signal conductor layer 20L, the second signal conductor layer 20C, and the third signal conductor layer 20R are electrically connected in series in this order. In addition, the length of the second signal conductor layer 20C between the interlayer connection conductor v1 and the interlayer connection conductor v2 is equal to or less than about ½ of the wave length of the high-frequency signal.

Such a first signal conductor layer 20L defines a strip line structure in the first section A1 as described below. More specifically, the ground conductor layer 22L is provided in the first section A1 of the laminated body 12. The ground conductor layer 22L overlaps the first signal conductor layer 20L when viewed in the laminated body up-down direction. The ground conductor layer 22L is located above the first signal conductor layer 20L in the laminated body up-down direction. In the present specification, "the ground conductor layer 22L is located above the first signal conductor layer 20L in the laminated body up-down direction" refers to the following state. At least a portion of the ground conductor layer 22L is arranged in a region through which the first signal conductor layer 20L passes when moving in parallel in a laminated body upward direction. Therefore, the ground conductor layer 22L may fall within the region through which the first signal conductor layer 20L passes when moving in parallel in the laminated body upward direction, or may protrude from the region through which the first signal conductor layer 20L passes when moving in parallel in the laminated body upward direction. In the present preferred embodiment, the ground conductor layer 22L protrudes from the region through which the first signal conductor layer 20L passes when moving in parallel or substantially in parallel in the laminated body upward direction. The ground conductor layer 22L is provided on the upper main surface of the insulator layer 16a in the first section A1. As illustrated in FIG. 2, the ground conductor layer 22L has a rectangular or substantially rectangular shape having long sides extending in the laminated body left-right direction when viewed in the laminated body up-down direction. The ground conductor layer 22 is connected to the ground.

The ground conductor layer 24L is provided in the first section A1 of the laminated body 12. The ground conductor layer 24L overlaps the first signal conductor layer 20L when viewed in the laminated body up-down direction. The ground conductor layer 24L is located below the first signal conductor layer 20L in the laminated body up-down direction. Thus, the ground conductor layer 24L is provided on the lower main surface of the insulator layer 16eL in the first section A1. As illustrated in FIG. 2, the ground conductor layer 24L has a rectangular or substantially rectangular shape having long sides extending in the laminated body left-right direction when viewed in the laminated body up-down direction. The ground conductor layer 24L is connected to the ground. As described above, the ground conductor layer 22L is provided above the first signal conductor layer 20L in the laminated body up-down direction, and the ground conductor layer 24L is provided below the first signal conductor layer 20L in the laminated body up-down direction. Thus, the first signal conductor layer 20L defines the strip line structure in the first section A1.

In addition, the third signal conductor layer 20R defines a strip line structure in the third section A3 as will be described below. To be specific, the ground conductor layer 22R is provided above the third signal conductor layer 20R in the laminated body up-down direction, and the ground conductor layer 24R is provided below the third signal conductor layer 20R in the laminated body up-down direction. However, the structure of the ground conductor layers 22R and 24R is bilaterally symmetrical to the structure of the ground conductor layers 22L and 24L. Therefore, description of the ground conductor layers 22R and 24R is omitted.

The second signal conductor layer 20C defines a coplanar line structure in the second section A2 as will be described below. More specifically, the ground conductor layer 25F is provided in the first section A1, the second section A2, and the third section A3 of the laminated body 12. The ground conductor layer 25F is provided on the upper main surface of an insulator layer 16c. Therefore, the position of the ground conductor layer 25F in the laminated body up-down direction is the same as the position of the second signal conductor layer 20C in the laminated body up-down direction. The ground conductor layer 25F is provided in front of the second signal conductor layer 20C in the laminated body front-back direction. The ground conductor layer 25F extends in the laminated body left-right direction. The left end of the ground conductor layer 25F is located at the right end portion of the first section A1. The right end of the ground conductor layer 25F is located at the left end portion of the third section A3.

The ground conductor layer 25B is provided in the first section A1, the second section A2, and the third section A3 of the laminated body 12. The ground conductor layer 25B is provided on the upper main surface of the insulator layer 16c Therefore, the position of the ground conductor layer 25B in the laminated body up-down direction is the same as the position of the second signal conductor layer 20C in the laminated body up-down direction. The ground conductor layer 25B is provided in the rear of the second signal conductor layer 20C in the laminated body front-back direction. The ground conductor layer 25B extends in the laminated body left-right direction. The left end of the ground conductor layer 25B is located at the right end portion of the first section A1. The right end of the ground conductor layer 25B is located at the left end portion of the third section A3. As described above, the ground conductor layer 25F is provided in front of the second signal conductor layer 20C in the laminated body front-back direction, and the ground conductor layer 25B is provided in the rear of the second signal conductor layer 20C in the laminated body front-back direction. Thus, the second signal conductor layer 20C defines the coplanar line structure in the second section A2.

In addition, in the second section A2, no conductor layer other than the second signal conductor layer 20C and the ground conductor layers 25F and 25B is provided. That is, in the second section A2, no conductor layer is provided at a position different from the position of the second signal conductor layer 20C in the laminated body up-down direction.

The interlayer connection conductor v3 electrically connects the ground conductor layer 22L, the ground conductor layer 25F, and the ground conductor layer 24L. More specifically, in the first section A1, the interlayer connection conductor v3 penetrates the insulator layers 16a to 16c, 16dL, and 16eL in the laminated body up-down direction. The upper end of the interlayer connection conductor v3 is connected to the right end portion of the ground conductor layer 22L. The lower end of the interlayer connection conductor v3 is connected to the right end portion of the ground conductor layer 24L. The intermediate portion of the interlayer connection conductor v3 is connected to the left end portion of the ground conductor layer 25F.

The interlayer connection conductor v4 electrically connects the ground conductor layer 22L, the ground conductor layer 25B, and the ground conductor layer 24L. More specifically, in the first section A1, the interlayer connection conductor v4 penetrates the insulator layers 16a to 16c, 16dL, and 16eL in the laminated body up-down direction. The upper end of the interlayer connection conductor v4 is connected to the right end portion of the ground conductor layer 22L. The lower end of the interlayer connection conductor v4 is connected to the right end portion of the ground conductor layer 24L. The intermediate portion of the interlayer connection conductor v4 is connected to the left end portion of the ground conductor layer 25B.

The interlayer connection conductor v5 electrically connects the ground conductor layer 22R, the ground conductor layer 25F, and the ground conductor layer 24R. The interlayer connection conductor v6 electrically connects the ground conductor layer 22R, the ground conductor layer 25B, and the ground conductor layer 24R. However, the structure of the interlayer connection conductors v5 and v6 is bilaterally symmetrical to the structure of the interlayer connection conductors v3 and v4. Therefore, description of the interlayer connection conductors v5 and v6 is omitted.

The outer electrode 26L is provided on the left portion of the lower main surface of the insulator layer 16eL. The outer electrode 26L has a rectangular or substantially rectangular shape when viewed in the laminated body up-down direction. The ground conductor layer 24L is not provided around the outer electrode 26L so that the outer electrode 26L is insulated from the ground conductor layer 24L. The outer electrode 26L overlaps the left end portion of the first signal conductor layer 20L when viewed in the laminated body up-down direction.

The interlayer connection conductor v7 electrically connects the outer electrode 26L and the first signal conductor layer 20L. To be specific, the interlayer connection conductor v7 passes through the insulator layers 16dL and 16eL in the laminated body up-down direction. The upper end of the interlayer connection conductor v7 is connected to the left end portion of the first signal conductor layer 20L. The lower end of the interlayer connection conductor v7 is connected to the outer electrode 26L. A high-frequency signal is input to and output from the first signal conductor layer 20L via the outer electrode 26L.

Note that the outer electrode 26R and the interlayer connection conductor v8 have a bilaterally symmetrical structure with respect to the outer electrode 26L and the interlayer connection conductor v7. Therefore, description of the outer electrode 26R and the interlayer connection conductor v8 will be omitted.

For example, the first signal conductor layer 20L, the second signal conductor layer 20C, the third signal conductor layer 20R, the ground conductor layers 22L, 22R, 24L, 24R, 25F, and 25B, and the outer electrodes 26L and 26R, as described above, are formed by etching copper foil provided on the upper main surface or the lower main surface of each of the insulator layers 16a to 16e. In addition, the interlayer connection conductors v1 to v8 are, for example, via-hole conductors. The via-hole conductors are produced by filling through-holes formed in the insulator layers 16a to 16e with a conductive paste and sintering the conductive paste.

The resist layers 18a and 18b are flexible insulator layers. The resist layers 18a and 18b are portion of the laminated body 12. The resist layers 18a and 18b have the same rectangular shape as the laminated body 12 when viewed in the laminated body up-down direction.

The resist layer 18a covers the entire upper main surface of the insulator layer 16a. Thus, the resist layer 18a protects the ground conductor layers 22L and 22R. The resist layer 18b covers the lower main surfaces of the insulator layers 16eL, 16c, and 16eR. Thus, the resist layer 18b protects the ground conductor layers 24L and 24R. However, openings h1 to h8 are provided in the resist layer 18b. The opening h1 overlaps the outer electrodes 26L when viewed in the laminated body up-down direction. Thus, the outer electrode 26L is exposed to the outside from the transmission line 10 through the opening h1. The opening h2 is provided in front of the opening h1 in the laminated body front-back direction. The opening h3 is provided to the left of the opening h1 in the laminated body left-right direction. The opening h4 is provided in the rear of the opening h1 in the laminated body front-back direction. Thus, the ground conductor layer 24L is exposed to the outside from the transmission line 10 through the openings h2 to h4. Note that the structures of the openings h5 to h8 are bilaterally symmetrical to the structures of the openings h1 to h4, respectively. Therefore, description of the openings h5 to h8 will be omitted.

In the above-described transmission line 10, as illustrated in FIG. 2, connectors 30L and 30R are mounted on the lower main surfaces of the first section A1 and the third section A3. More specifically, the connector 30L is mounted on the outer electrode 26L and the ground conductor layer 24L exposed from the openings h1 to h4. The connector 30R is mounted on the outer electrode 26R and the ground conductor layer 24R exposed from the openings h5 to h8.

Structure of Electronic Device

Next, the structure of an electronic device 1 including the transmission line 10 will be described with reference to the drawings. FIG. 3 is a back view of the electronic device 1 including the transmission line 10.

An x-axis, a y-axis, and a z-axis in the electronic device 1 are defined as follows. The x-axis is the laminated body left-right direction in the first section A1. The y-axis is the laminated body front-back direction in the first section A1. The z-axis is the laminated body up-down direction in the first section A1.

In addition, as illustrated in FIG. 3, the transmission line 10 is bent in a z-axis direction. Therefore, as illustrated in FIG. 3, the laminated body up-down direction and the laminated body left-right direction differ depending on the position of the transmission line 10. In the first section A1 and the third section A3 (for example, the position (1)) in which the laminated body 12 is not bent, the laminated body up-down direction and the laminated body left-right direction coincide with the z-axis direction and an x-axis direction, respectively. On the other hand, in the second section A2 (for example, the position (2)) in which the laminated body 12 is bent, the laminated body up-down direction and the laminated body left-right direction do not coincide with the z-axis direction and the x-axis direction, respectively.

As illustrated in FIG. 3, the electronic device 1 includes the transmission line 10, the connectors 30L and 30R, connectors 102L and 102R, a circuit substrate 100, and an article The circuit substrate 100 has a plate shape. The circuit substrate 100 (first circuit substrate) has a first main surface S1 (first circuit substrate first main surface) and a second main surface S2 (first circuit substrate second main surface). The first main surface S1 is located in a positive direction of the z-axis of the second main surface S2 (on the upper side in the laminated body up-down direction in the first section A1). The circuit substrate 100 includes a wiring conductor layer, a ground conductor layer, electrodes, and the like (not illustrated).

The connectors 102L and 102R are mounted on the first main surface S1 of the circuit substrate 100. The connectors 102L and 102R are connected to the connectors 30L and 30R, respectively. Thus, the transmission line 10 is provided in a positive direction of the z-axis of the first main surface S1 (on the upper side in the laminated body up-down direction in the first section A1).

The article 110 is provided on the first main surface S1 of the circuit substrate 100. The article 110 is, for example, an electronic component, a semiconductor integrated circuit, or the like. The article 110 is arranged in a space between the first section A1 and the second section A2 and in a space in a negative direction of the z-axis of the second section A2 (on the lower side in the laminated body up-down direction in the first section A1). However, the second section A2 is bent in the z-axis direction (the laminated body up-down direction in the first section A1) in order to avoid the article 110. More precisely, the second section A2 is bent so as to protrude in a positive direction of the z-axis (laminated body upward direction in the first section A1).

Effects

According to the transmission line 10, it is possible to arrange the article 110 around the transmission line 10 with a high degree of freedom, and to reduce or prevent breakage of the transmission line 10 due to bending of the transmission line 10. More specifically, the second section A2 is offset in the laminated body upward direction with respect to the first section A1 and the third section A3. That is, the thickness of the second section A2 in the laminated body up-down direction is smaller than the thickness of the first section A1 in the laminated body up-down direction and the thickness of the third section A3 in the laminated body up-down direction. Furthermore, the center C2 of the second section A2 in the laminated body up-down direction is located above, in the laminated body up-down direction, the center C1 of the first section A1 in the laminated body up-down direction and the center C3 of the third section A3 in the laminated body up-down direction. Accordingly, for example, the article 110 can be arranged in a space between the first section A1 and the second section A2 and in a space in the negative direction of the z-axis of the second section A2. As a result, the article 110 can be arranged around the transmission line 10 with a high degree of freedom.

However, when the second section A2 is offset in the laminated body upward direction with respect to the first section A1 and the third section A3, the neutral plane CF of the second section A2 is located above the neutral plane of the first section A1 and the neutral plane of the third section A3 in the laminated body up-down direction. It is assumed that, in the transmission line 10, the position of the second signal conductor layer 20C in the laminated body up-down direction is the same as the position of the first signal conductor layer 20L in the laminated body up-down direction and the position of the third signal conductor layer 20R in the laminated body up-down direction. In this case, the second signal conductor layer 20C will be far away from the neutral plane CF in the laminated body up-down direction. Therefore, when the second section A2 is bent, stresses are likely to occur in the second signal conductor layer 20C. That is, the second signal conductor layer 20C may be damaged or the second signal conductor layer 20C may be peeled off.

Therefore, in the transmission line 10, the distance between the second signal conductor layer 20C and the neutral plane CF of the second section A2 in the laminated body up-down direction is shorter than the distance between the first signal conductor layer 20L and the neutral plane CF of the second section A2 in the laminated body up-down direction and the distance between the third signal conductor layer 20R and the neutral plane CF of the second section A2 in the laminated body up-down direction. Thus, the second signal conductor layer 20C approaches the neutral plane CF. Therefore, when the second section A2 is bent, stresses generated in the second signal conductor layer 20C are reduced. As a result, it is possible to reduce or prevent breakage of the transmission line 10 due to bending of the transmission line 10. In particular, in the transmission line 10, the position of the second signal conductor layer 20C in the laminated body up-down direction includes the position of the neutral plane CF of the second section A2 in the laminated body up-down direction. Thus, when the second section A2 is bent, stresses generated in the second signal conductor layer 20C are more effectively reduced. As a result, it is possible to more effectively reduce or prevent breakage of the transmission line 10 due to bending of the transmission line 10.

However, in the transmission line 10, the interlayer connection conductor v1 electrically connects the first signal conductor layer 20L and the second signal conductor layer 20C. The interlayer connection conductor v2 electrically connects the second signal conductor layer 20C and the third signal conductor layer 20R. In this case, a difference occurs between the characteristic impedance of the interlayer connection conductors v1 and v2 and the characteristic impedance of the second signal conductor layer 20C. Therefore, reflection of a high-frequency signal may occur in the interlayer connection conductor v1 and the interlayer connection conductor v2. Such reflection of the high-frequency signal may generate a standing wave in the second signal conductor layer 20C between the interlayer connection conductor v1 and the interlayer connection conductor v2. Such a standing wave causes unnecessary radiation. Therefore, in the transmission line 10, the length of the second signal conductor layer 20C between the interlayer connection conductor v1 and the interlayer connection conductor v2 is equal to or less than about ½ of the wave length of the high-frequency signal transmitted by the transmission line 10. Thus, generation of the standing wave of a high-frequency signal transmitted by the transmission line 10 is reduced or prevented or prevented in the second signal conductor layer 20C between the interlayer connection conductor v1 and the interlayer connection conductor v2. Therefore, in the transmission line 10, the occurrence of the unnecessary radiation is reduced or prevented.

According to the transmission line 10, the second section A2 is easily bent in the z-axis direction. More specifically, in the second section A2, when a conductor layer is present at a position away from the neutral plane CF in the laminated body up-down direction, bending of the second section A2 in the z-axis direction is inhibited by the conductor layer. Therefore, in the transmission line 10, no conductor layer is provided in the second section A2 at a position different from the position of the second signal conductor layer 20C in the laminated body up-down direction. Thus, the conductor layer is not arranged at a position spaced away from the neutral plane CF of the second section A2 in the laminated body up-down direction. As a result, the second section A2 can be easily bent in the z-axis direction.

In the transmission line 10, the first signal conductor layer 20L defines a strip line structure in the first section A1. In addition, the third signal conductor layer 20R defines a strip line structure in the third section A3. This makes it possible to match the characteristic impedance of the first signal conductor layer 20L and the characteristic impedance of the third signal conductor layer 20R to the desired characteristic impedance (for example, 50Ω).

In the transmission line 10, mounting errors of the connectors 30L and 30R are less likely to occur. More specifically, the thickness of the first section A1 in the laminated body up-down direction and the thickness of the third section A3 in the laminated body up-down direction are greater than the thickness of the second section A2 in the laminated body up-down direction. Accordingly, the first section A1 and the third section A3 are less likely to be deformed than the second section A2. Therefore, the flatness of the upper main surface and the lower main surface of the first section A1 and the flatness of the upper main surface and the lower main surface of the third section A3 are maintained at high levels. Therefore, in the transmission line 10, the connectors 30L and 30R are mounted on the lower main surface of the laminated body 12 in the first section A1 and the third section A3. Accordingly, mounting errors of the connectors 30L and 30R due to deformation of the first section A1 and the third section A3 are reduced.

First Modification

Figure 4:
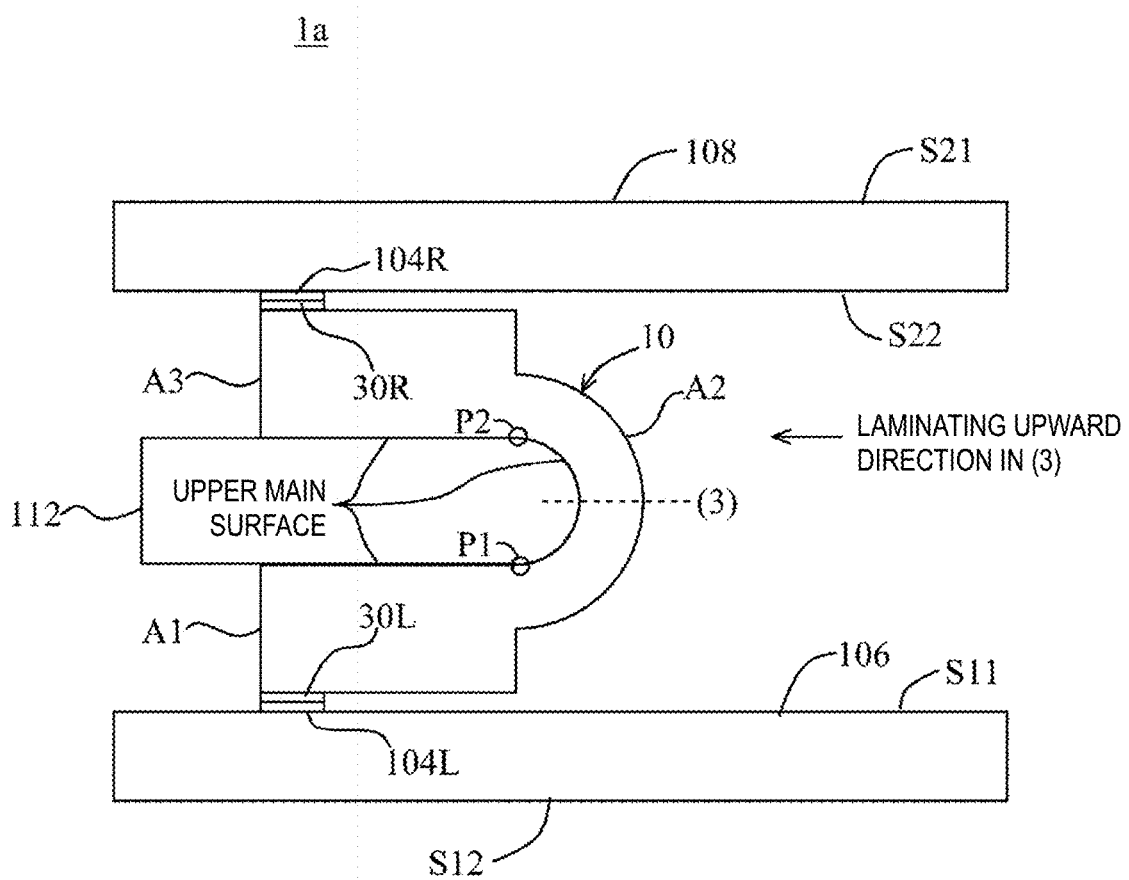

Hereinafter, an electronic device 1a according to a first modification of a preferred embodiment of the present invention will be described. FIG. 4 is a back view of the electronic device 1a.

As illustrated in FIG. 4, the electronic device 1a includes the transmission line 10, the connectors 30L and 30R, connectors 104L and 104R, circuit substrates 106 and 108, and an article 112.

The circuit substrates 106 and 108 each have a plate shape. The circuit substrate 106 (first circuit substrate) has a first main surface S11 (first circuit substrate first main surface) and a second main surface S12 (first circuit substrate second main surface). The first main surface S11 is located in a positive direction of the z-axis of the second main surface S12 (on the upper side in the laminated body up-down direction in the first section A1). The circuit substrate 106 includes a wiring conductor layer, a ground conductor layer, electrodes, and the like (not illustrated).

The circuit substrate 108 is located in a positive direction of the z-axis of the circuit substrate 106 (on the upper side in the laminated body up-down direction in the first section A1). The circuit substrate 108 (second circuit substrate) has a first main surface S21 (second circuit substrate first main surface) and a second main surface S22 (second circuit substrate second main surface). The first main surface S21 (second circuit substrate first main surface) is located in a positive direction of the z-axis (on the upper side in the laminated body up-down direction in the first section A1) of the second main surface S22 (second circuit substrate second main surface). Therefore, the first main surface S11 of the circuit substrate 106 faces the second main surface S22 of the circuit substrate 108. The circuit substrate 108 includes a wiring conductor layer, a ground conductor layer, electrodes, and the like (not illustrated).

The connector 104L is mounted on the first main surface S11 of the circuit substrate 106. The connector 104R is mounted on the second main surface S22 of the circuit substrate 108. The connectors 104L and 104R are connected to the connectors 30L and 30R, respectively. Therefore, the first section A1 is provided in a positive direction of the z-axis of the first main surface S11 (on the upper side in the laminated body up-down direction in the first section A1). The transmission line 10 is electrically connected to the circuit substrate 106 (first circuit substrate) in the first section A1. The third section A3 is provided in a negative direction of the z-axis of the second main surface S22 (on the lower side in the laminated body up-down direction in the first section A1). The transmission line 10 is electrically connected to the circuit substrate 108 in the third section A3.

In order to realize the above-described connection, the transmission line 10 is bent in a U shape. To be specific, the second section A2 is bent such that the upper main surface of the third section A3 and the upper main surface of the first section A1 face each other. Therefore, the third section A3 and the first section A1 are aligned in the z-axis direction.

The article 112 is, for example, an electronic component, a battery, or the like. The article 112 is arranged in a positive direction of the z-axis in the first section A1 and in a negative direction of the z-axis in the third section A3. Furthermore, the article 112 is in contact with the upper main surfaces of the first section A1, the second section A2, and the third section A3.

According to the electronic device 1a, the article 112 can be arranged so as to be in contact with the upper main surface of the second section A2. Therefore, according to the electronic device 1a, the article 112 can be arranged around the transmission line 10 with a high degree of freedom.

In addition, according to the electronic device 1a, the position of the upper main surface of the first section A1 in the laminated body up-down direction, the position of the upper main surface of the second section A2 in the laminated body up-down direction, and the position of the upper main surface of the third section A3 in the laminated body up-down direction are the same. Accordingly, when the second section A2 is bent such that the upper main surface of the third section A3 and the upper main surface of the first section A1 face each other, the first section A1 and the third section A3 do not protrude inward from the second section A2. As a result, the contact between the first section A1 and the third section A3 is reduced or prevented.

In addition, according to the electronic device 1a, breakage of the transmission line 10 is reduced or prevented. More specifically, a boundary between the first section A1 and the second section A2 on the upper main surface of the laminated body 12 is defined as a boundary P1. A boundary between the second section A2 and the third section A3 on the upper main surface of the laminated body 12 is defined as a boundary P2. When a step is provided at the boundaries P1 and P2, a slight space is defined between the transmission line 10 and the article 112 at the step of the boundaries P1 and P2. In this case, stresses concentrate on the boundaries P1 and P2.

Thus, the position of the upper main surface of the first section A1 in the laminated body up-down direction, the position of the upper main surface of the second section A2 in the laminated body up-down direction, and the position of the upper main surface of the third section A3 in the laminated body up-down direction are the same. Thus, no step is provided at the boundaries P1 and P2. As a result, even when the second section A2 is bent such that the upper main surface of the third section A3 and the upper main surface of the first section A1 face each other, concentration of the stresses on the boundaries P1 and P2 is reduced or prevented. As a result, breakage of the transmission line 10 is reduced or prevented.

Second Modification

Figure 5:
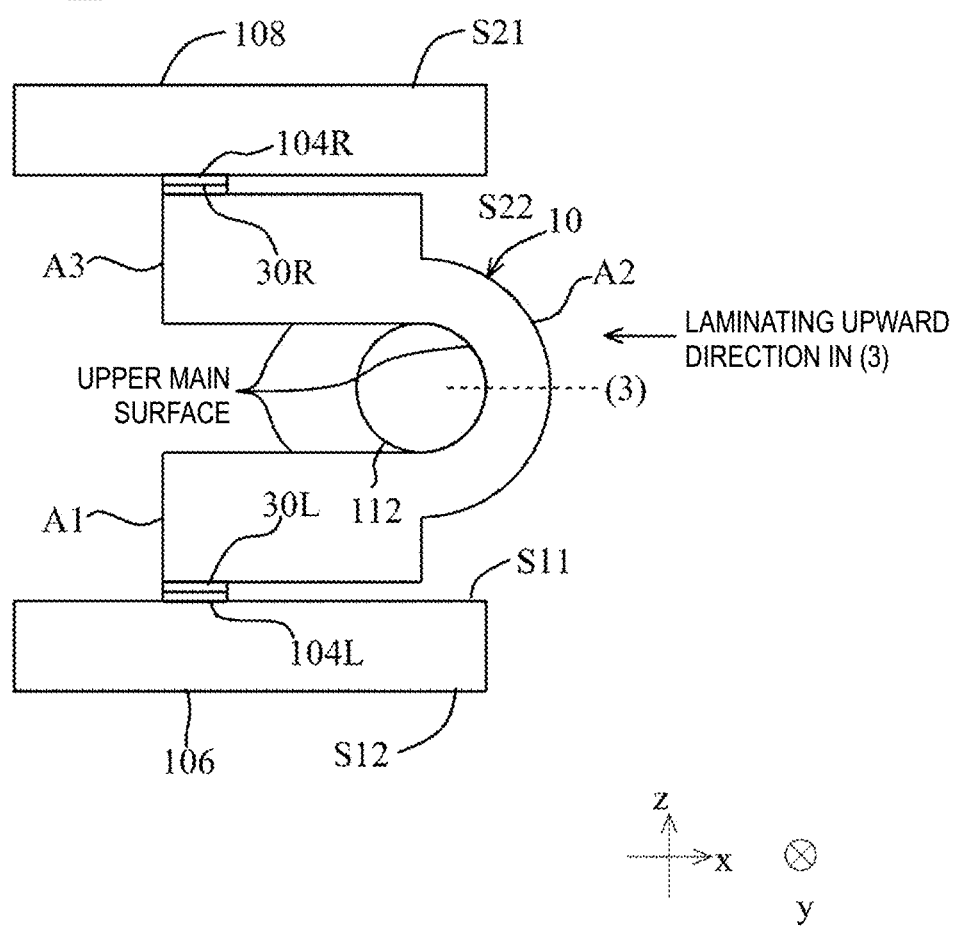
FIG. 5 is a back view of an electronic device 1b.
Figure 6:
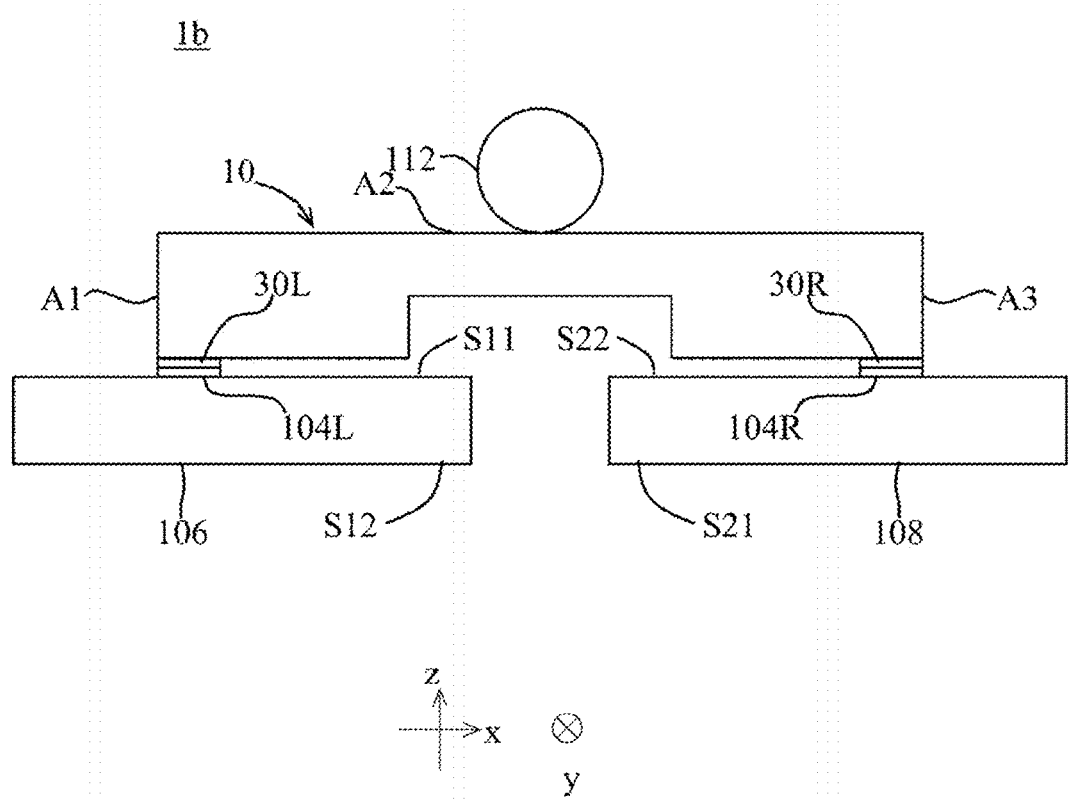
FIG. 6 is a back view of the electronic device 1b.

Hereinafter, an electronic device 1b according to a second modification of a preferred embodiment of the present invention will be described. FIG. 5 and FIG. 6 are back views of the electronic device 1b.

The electronic device 1b is different from the electronic device 1a in that the article 112 is a hinge. More specifically, the article 112 connects the circuit substrate 106 and the circuit substrate 108. Note that the manner of connection is not illustrated. The circuit substrate 108 can rotate with respect to the circuit substrate 106 as illustrated in FIG. 5 and FIG. 6. Therefore, the angle between the first main surface S11 and the second main surface S22 can be changed by the deformation of the second section A2. As described above, the transmission line 10 is arranged at a position where the bending operation and the stretching operation are repeated in the electronic device 1b.

Since the article 112 is the hinge, the operation of bending the transmission line 10 and the operation of stretching the transmission line 10 are repeated in the electronic device 1b. However, since the transmission line 10 has a structure that is not easily damaged, the durability of the electronic device 1b is improved.

Third Modification

Figure 7:
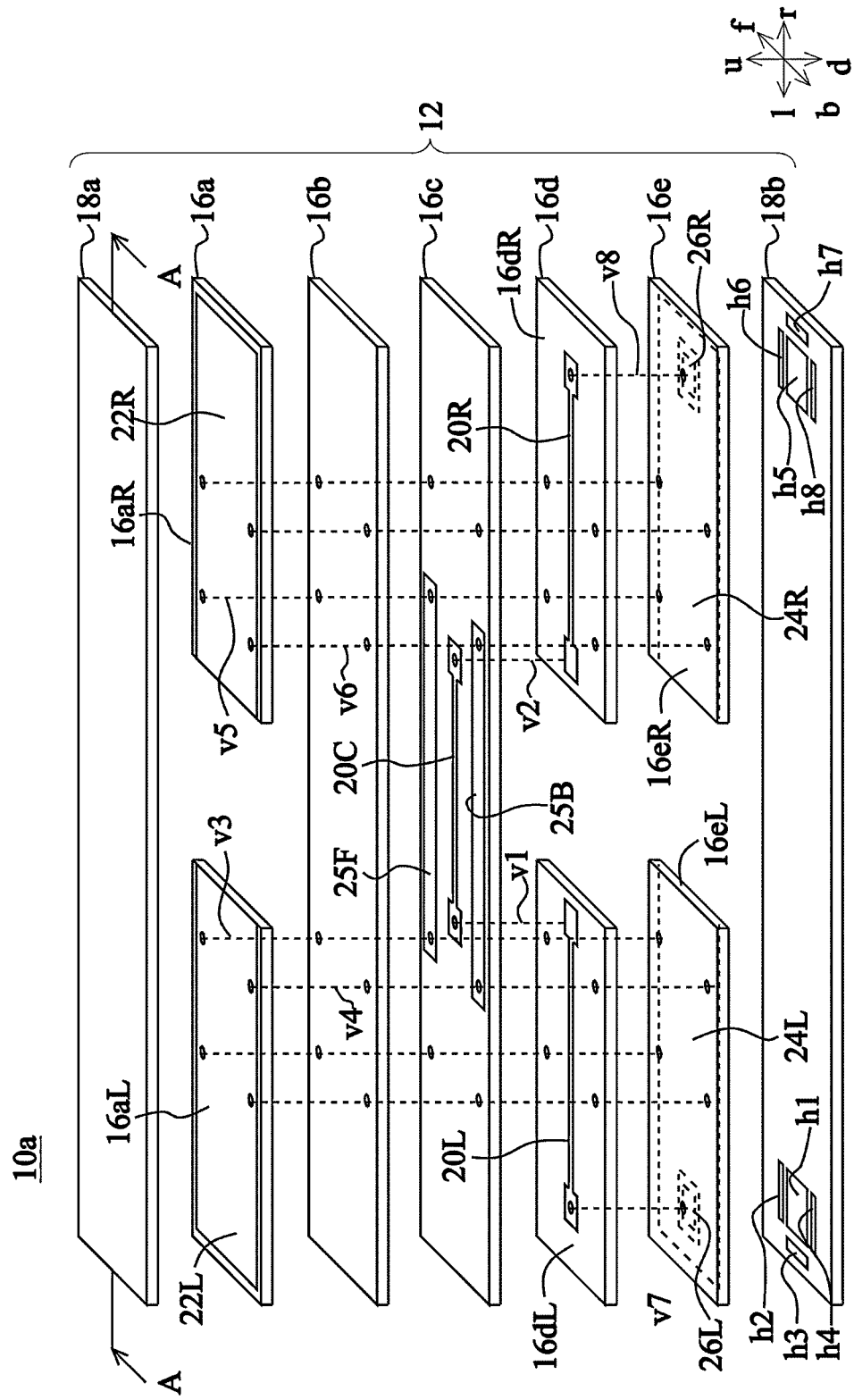

Hereinafter, a transmission line 10a according to a third modification of a preferred embodiment of the present invention will be described with reference to the drawings. FIG. 7 is an exploded perspective view of the transmission line 10a. FIG. 8 is a cross-sectional view of the transmission line 10a taken along a line A-A in FIG. 7.

The transmission line 10a differs from the transmission line 10 in the structure of the insulator layer 16a. More specifically, in the transmission line 10a, the insulator layer 16a includes an insulator layer 16aL and an insulator layer 16aR. The insulator layer 16aL is provided in the first section A1. The insulator layer 16aR is provided in the third section A3. Therefore, the insulator layer 16a is not provided in the second section A2. Thus, the position of the upper main surface of the first section A1 in the laminated body up-down direction and the position of the upper main surface of the third section A3 in the laminated body up-down direction are located above, in the laminated body up-down direction, the position of the upper main surface of the second section A2 in the laminated body up-down direction. Thus, the upper main surface of the laminated body 12 need not be a flat surface. That is, a step may be present on the upper main surface of the laminated body 12. Note that since the other structure of the transmission line 10a is the same as that of the transmission line 10, the description thereof is omitted.

Fourth Modification

Hereinafter, a transmission line 10b according to a fourth modification of a preferred embodiment of the present invention will be described with reference to the drawings. FIG. 9 is a cross-sectional view of the transmission line 10b.

The transmission line 10b differs from the transmission line 10 in the thickness of the first signal conductor layer 20L and the thickness of the third signal conductor layer 20R. More specifically, the thickness of the first signal conductor layer 20L and the thickness of the third signal conductor layer 20R are greater than the thickness of the second signal conductor layer 20C, the thicknesses of the ground conductor layers 22L, 22R, 24L, and 24R, and the thicknesses of the outer electrodes 26L and 26R. That is, the thickness of the second signal conductor layer 20C is smaller than the thickness of the first signal conductor layer 20L and the thickness of the third signal conductor layer 20R. Note that since the other structure of the transmission line 10b is the same as that of the transmission line 10, the description thereof is omitted.

According to the transmission line 10b, the second section A2 can be easily bent and insertion loss of the transmission line 10b can be reduced. More specifically, the thickness of the second signal conductor layer 20C is smaller than the thickness of the first signal conductor layer 20L and the thickness of the third signal conductor layer 20R. The second signal conductor layer 20C is provided in the second section A2. Therefore, the second section A2 is easily bent.

Meanwhile, the first section A1 and the third section A3 cannot be bent. Thus, the thickness of the first signal conductor layer 20L and the thickness of the third signal conductor layer 20R are greater than the thickness of the second signal conductor layer 20C. Accordingly, DC resistance values in the first section A1 and the third section A3 are reduced. As a result, the insertion loss of the transmission line 10b is reduced.

Fifth Modification

Hereinafter, a transmission line 10c according to a fifth modification of a preferred embodiment of the present invention will be described with reference to the drawings. FIG. 10 is a cross-sectional view of the transmission line 10c.

The transmission line 10c differs from the transmission line 10 in the thickness of the second signal conductor layer 20C. More specifically, the thickness of the second signal conductor layer 20C is smaller than the thickness of the first signal conductor layer 20L, the thickness of the third signal conductor layer 20R, the thicknesses of the ground conductor layers 22L, 22R, 24L, and 24R, and the thicknesses of the outer electrodes 26L and 26R. That is, the thickness of the second signal conductor layer 20C is smaller than the thickness of the first signal conductor layer 20L and the thickness of the third signal conductor layer 20R. Note that since the other structure of the transmission line 10c is the same as that of the transmission line 10, the description thereof is omitted. According to the transmission line 10c, for the same reason as the transmission line 10b, the second section A2 can be easily bent, and the insertion loss of the transmission line 10b can be reduced.

Other Preferred Embodiments

The transmission lines according to preferred embodiments of the present invention are not limited to the transmission lines 10 and 10a to 10c, and can be changed within the scope of the gist thereof. In addition, the configurations of the transmission lines 10 and 10a to 10c may be arbitrarily combined. In addition, the electronic devices according to preferred embodiments of the present invention are not limited to the electronic devices 1, 1a, and 1b, and can be changed within the scope of the gist of the invention. In addition, the configurations of the electronic devices 1, 1a, and 1b may be arbitrarily combined.

Note that in the transmission lines 10, 10a to 10c, in the second section A2, a conductor layer may be provided at a position different from the position of the second signal conductor layer 20C in the laminated body up-down direction.

Note that in the transmission lines 10, 10a to 10c, the first signal conductor layer 20L may define a coplanar line structure in the first section A1. The third signal conductor layer 20R may define a coplanar line structure in the third section A3.

Note that in the transmission lines 10, 10a to 10c, either the first signal conductor layer 20L may define a strip line structure in the first section A1 or the third signal conductor layer 20R may define a strip line structure in the third section A3.

Note that in the transmission lines 10, 10a to 10c, the connector may be mounted on the upper main surface and/or the lower main surface of the first section A1 and/or the third section A3. In addition, instead of the connector, a functional component may be mounted on the laminated body 12.

Note that in the transmission lines 10b and 10c, the thickness of the second signal conductor layer 20C may be smaller than the thickness of the first signal conductor layer 20L and/or the thickness of the third signal conductor layer 20R.

Note that in the transmission lines 10b and 10c, the position of the second signal conductor layer 20C in the laminated body up-down direction need not include the position of the neutral plane CF of the second section A2 in the laminated body up-down direction.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line to transmit a high-frequency signal, the transmission line comprising:
    a laminated body including a structure in which a plurality of insulator layers is laminated in a laminated body up-down direction, the laminated body including a first section, a second section, and a third section, the first section, the second section, and the third section being arranged in this order in a transmission direction of the high-frequency signal;
    a first signal conductor layer in the first section;
    a second signal conductor layer in the first section, the second section, and the third section;
    a third signal conductor layer in the third section;
    a first interlayer connection conductor that penetrates the insulator layer in the laminated body up-down direction in the first section and electrically connects the first signal conductor layer and the second signal conductor layer to each other; and
    a second interlayer connection conductor that penetrates the insulator layer in the laminated body up-down direction in the third section and electrically connects the second signal conductor layer and the third signal conductor layer to each other; wherein
    the second signal conductor layer defines a coplanar line structure in the second section;
    a thickness of the second section in the laminated body up-down direction is smaller than a thickness of the first section in the laminated body up-down direction and a thickness of the third section in the laminated body up-down direction;
    a center of the second section in the laminated body up-down direction is above, in the laminated body up-down direction, a center of the first section in a laminated body up-down direction and a center of the third section in the laminated body up-down direction;
    a distance between the second signal conductor layer and a neutral plane of the second section in the laminated body up-down direction is shorter than a distance between the first signal conductor layer and the neutral plane of the second section in the laminated body up-down direction and a distance between the third signal conductor layer and the neutral plane of the second section in the laminated body up-down direction;
    a position of the second signal conductor layer in the laminated body up-down direction is above, in the laminated body up-down direction, a position of the first signal conductor layer in the laminated body up-down direction and a position of the third signal conductor layer in the laminated body up-down direction;
    a length of the second signal conductor layer between the first interlayer connection conductor and the second interlayer connection conductor is equal to or less than about ½ of a wavelength of the high-frequency signal;
    the plurality of insulator layers include a first layer that is an outermost layer in the laminated body up-down direction;
    the first layer is included in each of the first section, the second section, and the third section; and
    a portion of the first layer included in the second section is above, in the laminated body up-down direction, a portion of the first layer in the first section and a portion of the first layer in the third section.

2. The transmission line according to claim 1, wherein the second section is bent such that an upper main surface of the third section and an upper main surface of the first section face each other.

3. The transmission line according to claim 2, wherein an article is in contact with upper main surfaces of the first section, the second section, and the third section.

4. The transmission line according to claim 1, wherein in the second section, a conductor layer is not provided at a position different from a position of the second signal conductor layer in the laminated body up-down direction.

5. The transmission line according to claim 1, wherein the first signal conductor layer defines a strip line structure in the first section, and/or the third signal conductor layer defines a strip line structure in the third section.

6. The transmission line according to claim 1, wherein a connector or a functional component is mounted on an upper main surface and/or a lower main surface of the first section and/or the third section.

7. The transmission line according to claim 1, wherein a position of an upper main surface of the first section in the laminated body up-down direction, a position of an upper main surface of the second section in the laminated body up-down direction, and a position of an upper main surface of the third section in the laminated body up-down direction are the same.

8. The transmission line according to claim 1, wherein a thickness of the second signal conductor layer is smaller than a thickness of the first signal conductor layer and/or a thickness of the third signal conductor layer.

9. The transmission line according to claim 1, wherein a position of the second signal conductor layer in the laminated body up-down direction includes a position of the neutral plane of the second section in the laminated body up-down direction.

10. The transmission line according to claim 1, wherein an article is located in a space between the first section and the second section and in a lower space of the second section in the laminated body up-down direction.

11. An electronic device comprising:
    a first circuit substrate including a first circuit substrate first main surface and a first circuit substrate second main surface; and
    a transmission line electrically connected to the first circuit substrate to transmit a high-frequency signal; wherein
    the transmission line includes:

a laminated body including a structure in which a plurality of insulator layers is laminated in a laminated body up-down direction, the laminated body including a first section, a second section, and a third section, the first section, the second section, and the third section being arranged in this order in a transmission direction of the high-frequency signal;

a first signal conductor layer in the first section;

a second signal conductor layer in the first section, the second section, and the third section;

a third signal conductor layer in the third section;

a first interlayer connection conductor that penetrates the insulator layer in the laminated body up-down direction in the first section and electrically connects the first signal conductor layer and the second signal conductor layer to each other; and a second interlayer connection conductor that penetrates the insulator layer in the laminated body up-down direction in the third section and electrically connects the second signal conductor layer and the third signal conductor layer to each other;

the second signal conductor layer defines a coplanar line structure in the second section;

a thickness of the second section in the laminated body up-down direction is smaller than a thickness of the first section in the laminated body up-down direction and a thickness of the third section in the laminated body up-down direction;

a center of the second section in the laminated body up-down direction is above, in the laminated body up-down direction, a center of the first section in the laminated body up-down direction and a center of the third section in the laminated body up-down direction;

a distance between the second signal conductor layer and a neutral plane of the second section in the laminated body up-down direction is shorter than a distance between the first signal conductor layer and the neutral plane of the second section in the laminated body up-down direction and a distance between the third signal conductor layer and the neutral plane of the second section in the laminated body up-down direction;

a position of the second signal conductor layer in the laminated body up-down direction is above, in the laminated body up-down direction, a position of the first signal conductor layer in the laminated body up-down direction and a position of the third signal conductor layer in the laminated body up-down direction;

a length of the second signal conductor layer between the first interlayer connection conductor and the second interlayer connection conductor is equal to or less than about ½ of a wavelength of the high-frequency signal;

the plurality of insulator layers include a first layer that is an outermost layer in the laminated body up-down direction;

the first layer is included in each of the first section, the second section, and the third section; and a portion of the first layer included in the second section is above, in the laminated body up-down direction, a portion of the first layer in the first section and a portion of the first layer in the third section.

12. The electronic device according to claim 11, further comprising a second circuit substrate above the first circuit substrate in the laminated body up-down direction in the first section and including a second circuit substrate first main surface and a second circuit substrate second main surface; wherein the transmission line is electrically connected to the first circuit substrate in the first section;

the transmission line is electrically connected to the second circuit substrate in the third section;

the first circuit substrate first main surface is above the first circuit substrate second main surface in the laminated body up-down direction in the first section;

the first section is above the first circuit substrate first main surface in the laminated body up-down direction in the first section;

the second circuit substrate first main surface is above the second circuit substrate second main surface in the laminated body up-down direction in the first section;

the third section is below the second circuit substrate second main surface in the laminated body up-down direction in the first section; and the second section is bent such that an upper main surface of the third section and an upper main surface of the first section face each other.

13. The electronic device according to claim 12, wherein an article is in contact with upper main surfaces of the first section, the second section, and the third section.

14. The electronic device according to claim 12, wherein an angle between the first circuit substrate first main surface and the second circuit substrate second main surface is able to be changed by deformation of the second section.

15. The electronic device according to claim 11, further comprising an article on the first circuit substrate first main surface; wherein the first circuit substrate first main surface is above the first circuit substrate second main surface in the laminated body up-down direction in the first section;

the transmission line is above the first circuit substrate first main surface in the laminated body up-down direction in the first section;

the article is in a space between the first section and the second section and in a lower space of the second section in the laminated body up-down direction in the first section; and the second section is bent so as to protrude in a laminated body upward direction in the first section.

16. A transmission line to transmit a high-frequency signal, the transmission line comprising:

a laminated body including a structure in which a plurality of insulator layers is laminated in a laminated body up-down direction, the laminated body including a first section, a second section, and a third section, the first section, the second section, and the third section being arranged in this order in a transmission direction of the high-frequency signal;

a first signal conductor layer in the first section;

a second signal conductor layer in the first section, the second section, and the third section;

a third signal conductor layer in the third section;

a first interlayer connection conductor that penetrates the insulator layer in the laminated body up-down direction in the first section and electrically connects the first signal conductor layer and the second signal conductor layer to each other; and a second interlayer connection conductor that penetrates the insulator layer in the laminated body up-down direction in the third section and electrically connects the second signal conductor layer and the third signal conductor layer to each other; wherein the second signal conductor layer defines a coplanar line structure in the second section;

a thickness of the second section in the laminated body up-down direction is smaller than a thickness of the first section in the laminated body up-down direction and a thickness of the third section in the laminated body up-down direction;

a center of the second section in the laminated body up-down direction is above, in the laminated body up-down direction, a center of the first section in a laminated body up-down direction and a center of the third section in the laminated body up-down direction;

a distance between the second signal conductor layer and a neutral plane of the second section in the laminated body up-down direction is shorter than a distance between the first signal conductor layer and the neutral plane of the second section in the laminated body up-down direction and a distance between the third signal conductor layer and the neutral plane of the second section in the laminated body up-down direction;

a position of the second signal conductor layer in the laminated body up-down direction is above, in the laminated body up-down direction, a position of the first signal conductor layer in the laminated body up-down direction and a position of the third signal conductor layer in the laminated body up-down direction;

the second section is bent such that an upper main surface of the third section and an upper main surface of the first section face each other;

the plurality of insulator layers include a first layer that is an outermost layer in the laminated body up-down direction;

the first layer is included in each of the first section, the second section, and the third section; and a portion of the first layer included in the second section is above, in the laminated body up-down direction, a portion of the first layer in the first section and a portion of the first layer in the third section.

17. The transmission line according to claim 16, wherein the second section is bent so as to protrude in a laminated body upward direction in the first section.

18. The transmission line according to claim 16, wherein the second section is bent such that an upper main surface of the third section and an upper main surface of the first section face each other.

19. The transmission line according to claim 16, wherein a length of the second signal conductor layer between the first interlayer connection conductor and the second interlayer connection conductor is equal to or less than about ½ of a wavelength of the high-frequency signal.

20. The transmission line according to claim 16, wherein a distance between the second signal conductor layer and a neutral plane of the second section in the laminated body up-down direction is shorter than a distance between the first signal conductor layer and the neutral plane of the second section in the laminated body up-down direction and a distance between the third signal conductor layer and the neutral plane of the second section in the laminated body up-down direction.

* * * * *